United States Patent
Shimohata et al.

(10) Patent No.: US 7,568,609 B2
(45) Date of Patent: Aug. 4, 2009

(54) WELDING METHOD

(75) Inventors: Sachio Shimohata, Hyogo (JP); Masahiko Mega, Hyogo (JP); Kimihiro Kishi, Aichi (JP); Seiji Katayama, Osaka (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 282 days.

(21) Appl. No.: 10/935,074

(22) Filed: Sep. 8, 2004

(65) Prior Publication Data
US 2005/0109818 A1  May 26, 2005

(30) Foreign Application Priority Data
Nov. 21, 2003  (JP) ............................. 2003-392694

(51) Int. Cl.
*B23K 31/00* (2006.01)
*B23K 35/24* (2006.01)

(52) U.S. Cl. .................. 228/119; 228/225; 228/232

(58) Field of Classification Search ............... None
See application file for complete search history.

(56) References Cited

U.S. PATENT DOCUMENTS

| 3,610,876 | A | * | 10/1971 | Bhat .................. 219/137 R |
| 3,653,432 | A | * | 4/1972 | Schmid et al. ................ 117/83 |
| 4,605,452 | A | * | 8/1986 | Gemma et al. .............. 148/404 |
| 5,071,059 | A | | 12/1991 | Heitman et al. |
| 5,151,249 | A | * | 9/1992 | Austin et al. ................ 420/445 |
| 5,846,057 | A | * | 12/1998 | Ferrigno et al. .......... 416/241 R |
| 6,127,044 | A | * | 10/2000 | Yamamoto et al. .......... 428/603 |
| 6,191,379 | B1 | | 2/2001 | Offer et al. |
| 6,308,767 | B1 | * | 10/2001 | Hugo et al. ............... 164/122.1 |
| RE37,562 | E | * | 2/2002 | Clark et al. .............. 416/241 R |
| 6,446,701 | B1 | * | 9/2002 | Das ......................... 164/338.1 |
| 6,818,077 | B2 | * | 11/2004 | Yoshinari et al. ............ 148/428 |
| 2002/0179583 | A1 | * | 12/2002 | Copeland et al. ..... 219/137 WM |

FOREIGN PATENT DOCUMENTS

| CN | 1339996 A | | 3/2002 |
| JP | 362282796 A | * | 12/1987 |
| JP | 363118017 A | * | 5/1988 |
| JP | 07-075893 A | | 3/1995 |
| JP | 9-110596 A | | 4/1997 |
| JP | 2000102866 A | * | 4/2000 |
| JP | 2000102866 A | | 4/2000 |
| JP | 2000-301376 A | | 10/2000 |
| JP | 2001-269784 A | | 10/2001 |
| JP | 2001-288554 A | | 10/2001 |
| JP | 2003053533 A | | 2/2003 |
| RU | 2196672 | | 1/2003 |
| WO | WO-01/41970 A1 | | 6/2001 |

* cited by examiner

*Primary Examiner*—Kiley Stoner
(74) *Attorney, Agent, or Firm*—Birch, Stewart, Kolasch & Birch, LLP

(57) ABSTRACT

A welding method forms a molten build-up portion on a base material that is any one of a single crystal material and a unidirectionally solidified crystal material. The method includes forming a plurality of build-up portions on the base material while maintaining a predetermined gap between adjacent build-up portions; and forming a build-up portion in each of the predetermined gaps.

23 Claims, 23 Drawing Sheets

MOLTEN BASE METAL TREATMENT BY LASER

WELDING METHOD

This Nonprovisional application claims priority under 35 U.S.C. § 119(a) on Patent Application No(s). 2003-392694 filed in Japan on Nov. 21, 2003, the entire contents of which are hereby incorporated by reference.

BACKGROUND OF THE INVENTION

1) Field of the Invention

The present invention relates to a welding method for forming a build-up layer on base materials having a directionally solidified crystal, such as a single crystal material or a unidirectionally solidified crystal material.

2) Description of the Related Art

A centrifugal force works on buckets of a turbine, a jet engine and the like, which rotate at high speed; therefore, a unidirectionally solidified crystal bucket of which crystal orientation is oriented to a direction of a centrifugal force or a single crystal bucket that is wholly formed by a single crystal material are used for the above-mentioned buckets. Cracks or fractures occur in these directionally solidified crystal buckets through use. And casting defects occur during a manufacturing process.

Conventionally, these defects that occurred in the buckets have been repaired through brazing or welding. There is no problem in repairing ordinary casting buckets through the conventional repairing methods. However, if the conventional repairing methods such as brazing or welding are applied to the directionally solidified crystal buckets such as the single crystal bucket or the unidirectionally solidified crystal bucket, strength of the repaired part problematically lowers due to the repaired part does not become the directionally solidified crystal.

To solve the above-mentioned problem, a repairing method that includes the following steps is proposed by Japanese Patent Application Laid-Open No. H9-110596. First, removing the defective portion from the base material so that the surface of the base material orients to a direction of preferential crystal growth of the base material; second, carrying out repairing steps by adding a filler material, irradiating the portion to be repaired with a laser beam at a relatively low output power density, so that a diameter of the laser beam becomes relatively smaller, irradiating relatively longer time, and creating a molten pool the ratio of depth to width thereof is small.

However, the above-mentioned method requires removing a broad area of the base material for repairing, and takes a long time for melting, which is inefficient. Furthermore, the direction of the crystal growth in lateral ends of the molten pool is quite different from other parts of the molten pool, which is a problem.

As a method of forming a single crystal build-up portion on a base material, as shown in FIG. 21, there is a method of building up the build-up portion by a half-overlapping method. However, this method has problems of causing uneven distribution of temperature and a filler material, and causing other crystals (different crystals) because it is impossible to control the temperature distribution suitable for controlling the crystalline structure.

SUMMARY OF THE INVENTION

It is an object of the present invention to solve at least the problems in the conventional technology.

A welding method according to an aspect of the present invention is a method for forming a molten build-up portion on a base material that is any one of a single crystal material and a unidirectionally solidified crystal material. The welding method includes forming a plurality of build-up portions on the base material while maintaining a predetermined gap between adjacent build-up portions; and forming a build-up portion in each of the predetermined gaps.

A welding method according to another aspect of the present invention is a method for forming a molten build-up portion on a base material that is any one of a single crystal material and a unidirectionally solidified crystal material. The welding method includes forming a plurality of build-up portions on the base material while maintaining a first predetermined gap between adjacent build-up portions; forming a first build-up layer by forming a build-up portion in each of the first predetermined gaps; forming a plurality of build-up portions on the first build-up layer while maintaining a second predetermined gap between adjacent build-up portions; and forming a second build-up layer by forming a build-up portion in each of the second predetermined gaps.

A repairing method according to still another aspect of the present invention is a method for repairing a defective part in a base material. The repairing method includes removing the defective part from a cast metal to thereby forming a concave portion; and forming a plurality of build-up portions in the concave portion using the welding method according to the above aspect of the present invention.

A joining method according to still another aspect of the present invention is a method for joining a joining material with a base material. The joining method includes forming an edge preparation portion across the joining material and the base material; and forming a plurality of build-up layers in the edge preparation portion using the welding method according to the above aspect of the present invention.

A welding method according to still another aspect of the present invention is a method for providing a welding portion on the base material. The welding method includes a pretreatment that includes conducting solution treatment at a temperature T1 that is lower than the solidus temperature of the base material by 30 degrees Celsius (° C.) to 50° C.; and conducting heat treatment at a temperature that is higher than the temperature T1 to prevent a precipitated material or a micro segregation from occurring.

The other objects, features, and advantages of the present invention are specifically set forth in or will become apparent from the following detailed description of the invention when read in conjunction with the accompanying drawings.

DETAILED DESCRIPTION OF THE INVENTION

Exemplary embodiments of the present invention will be explained below in detail with reference to the accompanying drawings. The present invention is not limited to the embodiments described below. Components described in the following embodiments include such components that are easily anticipated from the following embodiments by a person skilled in the art, and such components that are substantially the same as the components described in the following embodiments.

Figure 1:
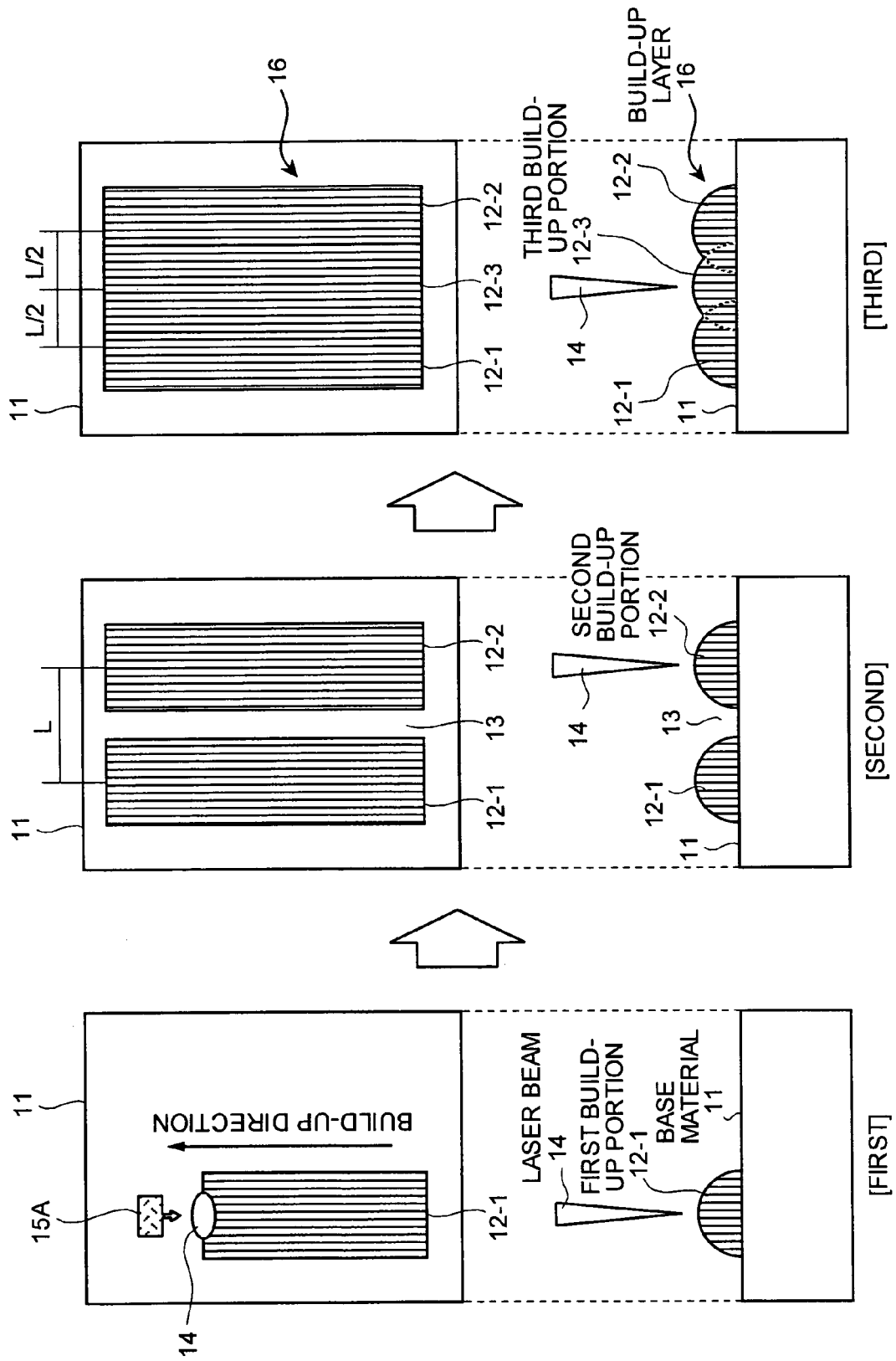
FIG. 1 is a schematic diagram that illustrates a method of forming a build-up layer according to a first embodiment.

FIG. 1 is a process diagram for explaining formation of a build-up layer according to the first embodiment. The upper part of FIG. 1 is a top view, and the lower part is a side view.

A method according to the first embodiment of the present invention includes forming a molten build-up portion 12 on a base material of single crystal or unidirectionally solidified crystal through heating by a heat source. A plurality of build-up portions (two build-up portions in the present embodiment), a first build-up portion 12-1 and then a second build-up portion 12-2 are formed having a predetermined gap 13 between the first and second build-up portions, then a third build-up portion 12-3 is formed in the gap 13.

It is possible to soundly form a single crystal, because the third build-up portion 12-3 is formed in the gap between the first build-up portion 12-1 and the second build-up portion 12-2.

Namely, it is possible to form the second build-up portion 12-2 without a thermal influence of the first build-up portion 12-1, because the gap 13 is provided between the first build-up portion 12-1 and the second build-up portion 12-2. The third build-up portion 12-3 is formed without a different crystal growth, because the first build-up portion 12-1 and the second build-up portion 12-2 provide the third build-up portion 12-3 with a symmetric thermal condition.

One of publicly known heat sources that can heat things up locally, for example, a laser beam, an electron beam, plasma and the like may be applied as a heat source. In the embodiment shown in FIG. 1, a welding portion is formed using a laser beam 14.

Metals, polymeric materials, ceramics, and the like are used as a filler material. There is no limitation in ways of feeding the filler materials; wire feeding, powder feeding, powder laying and the like may be applied.

Figure 2:
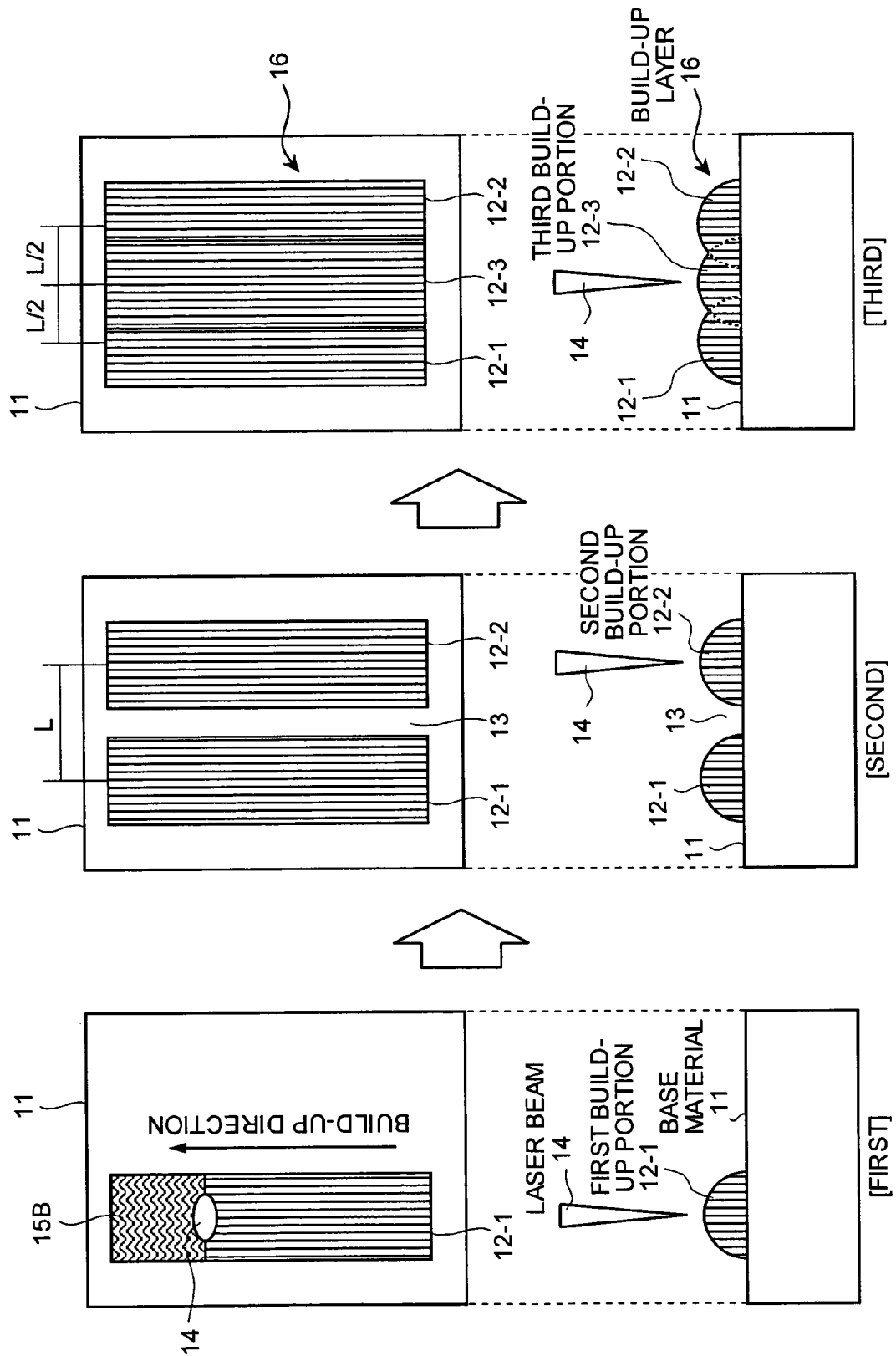
FIG. 2 is a schematic diagram that illustrates another method of forming a build-up layer according to the first embodiment.
Figure 3:
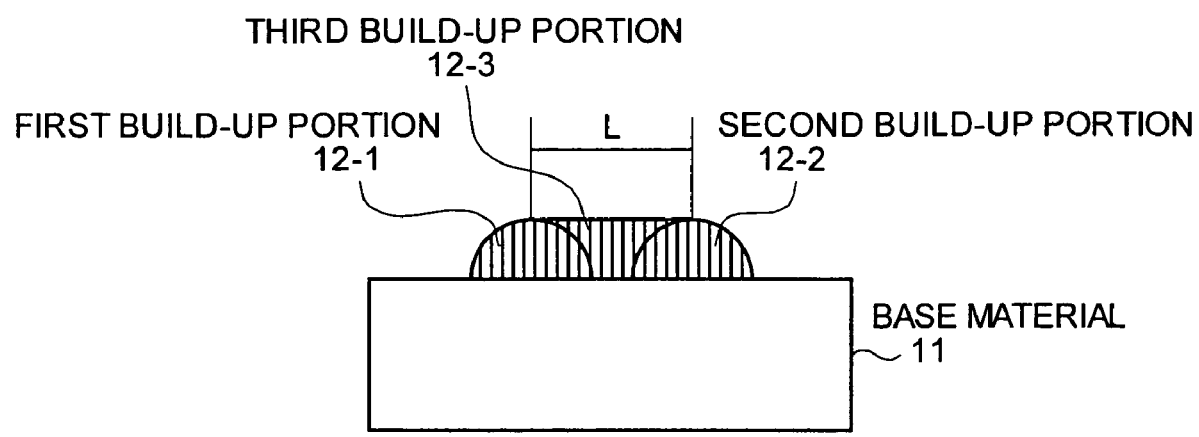
FIG. 3 is a front view of the build-up layer according to the first embodiment.

In the embodiment shown in FIG. 1, the filler material is fed in a form of powder filler 15A, and in the embodiment shown in FIG. 2, the filler material is fed in a form of laid powder (or laid wire) 15B.

In the embodiments shown in FIG. 1 and FIG. 2, the build-up layer (2-millimeter wide) was formed on the base material 11, using, for example, a 2-millimeter in diameter round YAG laser beam 14 (scan speed: 5 millimeter/second), heating at a condition of an initial temperature of 20° C. with an incident heat of 500 watt/square millimeter, and feeding the filler material 15 (grain size: 50 micrometers) at a rate of 2 grams/minute.

A distance L, which is the distance between the first build-up portion 12-1 and the second build-up portion 12-2, is set so that the cross sectional area of the third build-up portion 12-3 becomes the same as the cross sectional area of the build-up portion 12-1.

As a result, the surface of a build-up layer 16 that consists of the first build-up portion 12-1, the second build-up portion 12-2, and the third build-up portion 12-3 becomes substantially flat, which is preferable. A columnar build-up portion can be formed by piling up the build-up layers 16 many times.

Figure 4:
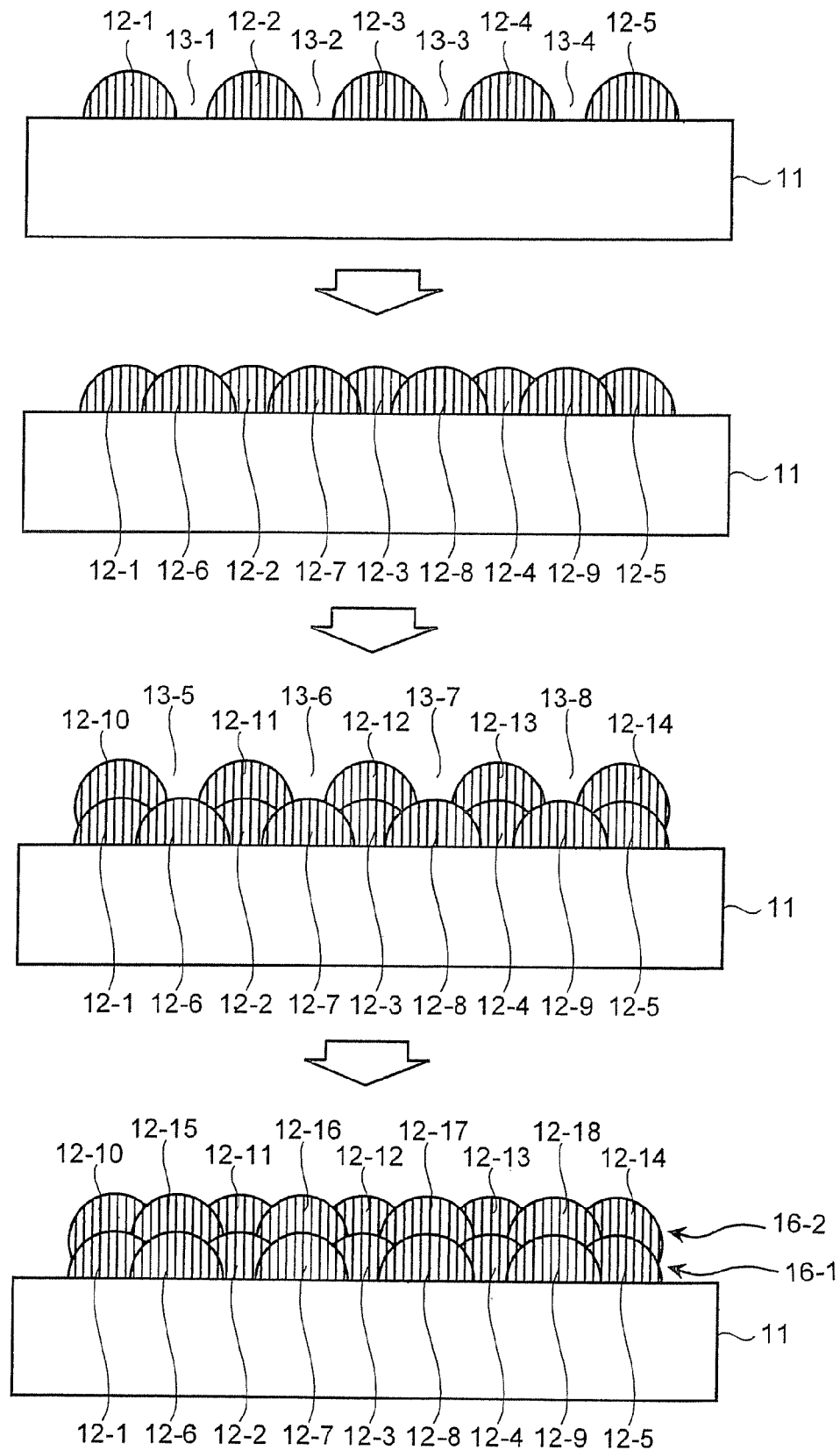
FIG. 4 is a schematic diagram that illustrates a method of forming a build-up layer according to a second embodiment.

FIG. 4 is a cross section for explaining formation of a build-up layer according to the second embodiment of the present invention. The same reference numerals are given to the same members that are described in the first embodiment; therefore, explanations of the same reference numerals are omitted.

A method of forming a build-up portion according to the second embodiment of the present invention is a welding method of forming a molten build-up portion 12 on a base material of single crystal or unidirectionally solidified crystal through heating by a heat source. A plurality of build-up portions (five build-up portions in the present embodiment), a first build-up portion 12-1, a second build-up portion 12-2, a third build-up portion 12-3, a fourth build-up portion 12-4, and a fifth build-up portion 12-5 are formed having a predetermined gap 13. From a sixth build-up portion 12-6 to a ninth build-up portion 12-9 are formed in gaps 13-1 to 13-4 forming a first build-up layer 16-1.

Next, a tenth build-up portion 12-10, an eleventh build-up portion 12-11, a twelfth build-up portion 12-12, a thirteenth build-up portion 12-13, and a fourteenth build-up portion 12-14 are formed on the first build-up layer 16-1 having gaps 13-5 to 13-8. From a fifteenth build-up portion 12-15 to an eighteenth build-up portion 12-18 are formed in gaps 13-5 to 13-8 forming a second build-up layer 16-2.

As a result, the first build-up layer 16-1 is formed satisfactorily without a different crystal growth, because the both side build-up portions that constitute the gap secure a symmetric thermal condition. In a same manner, the second build-up layer 16-2 is formed on the first build-up layer 16-1.

Figure 20:
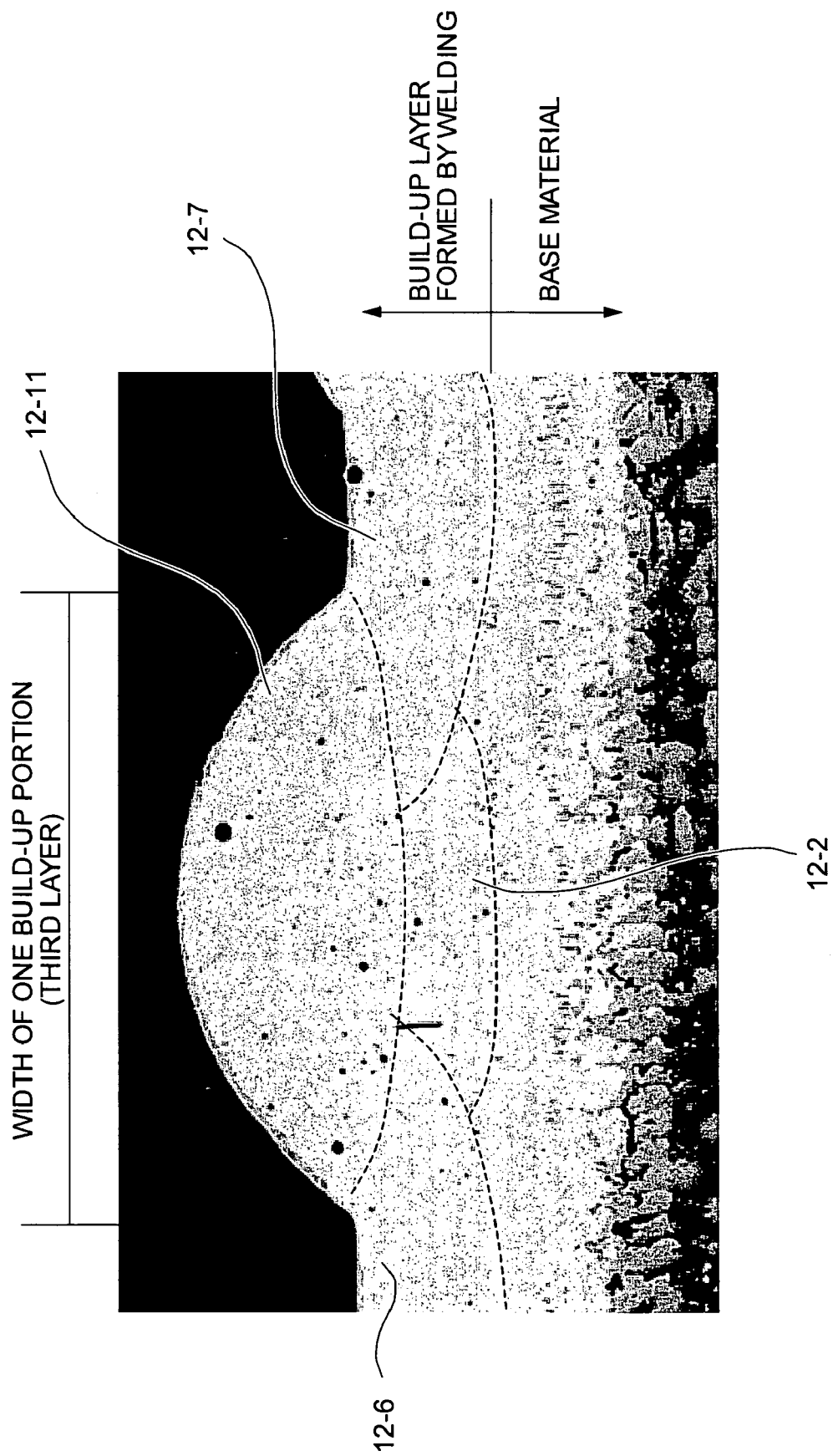
FIG. 20 is a photomicrograph of the build-up layer according to the second embodiment.
Figure 21:
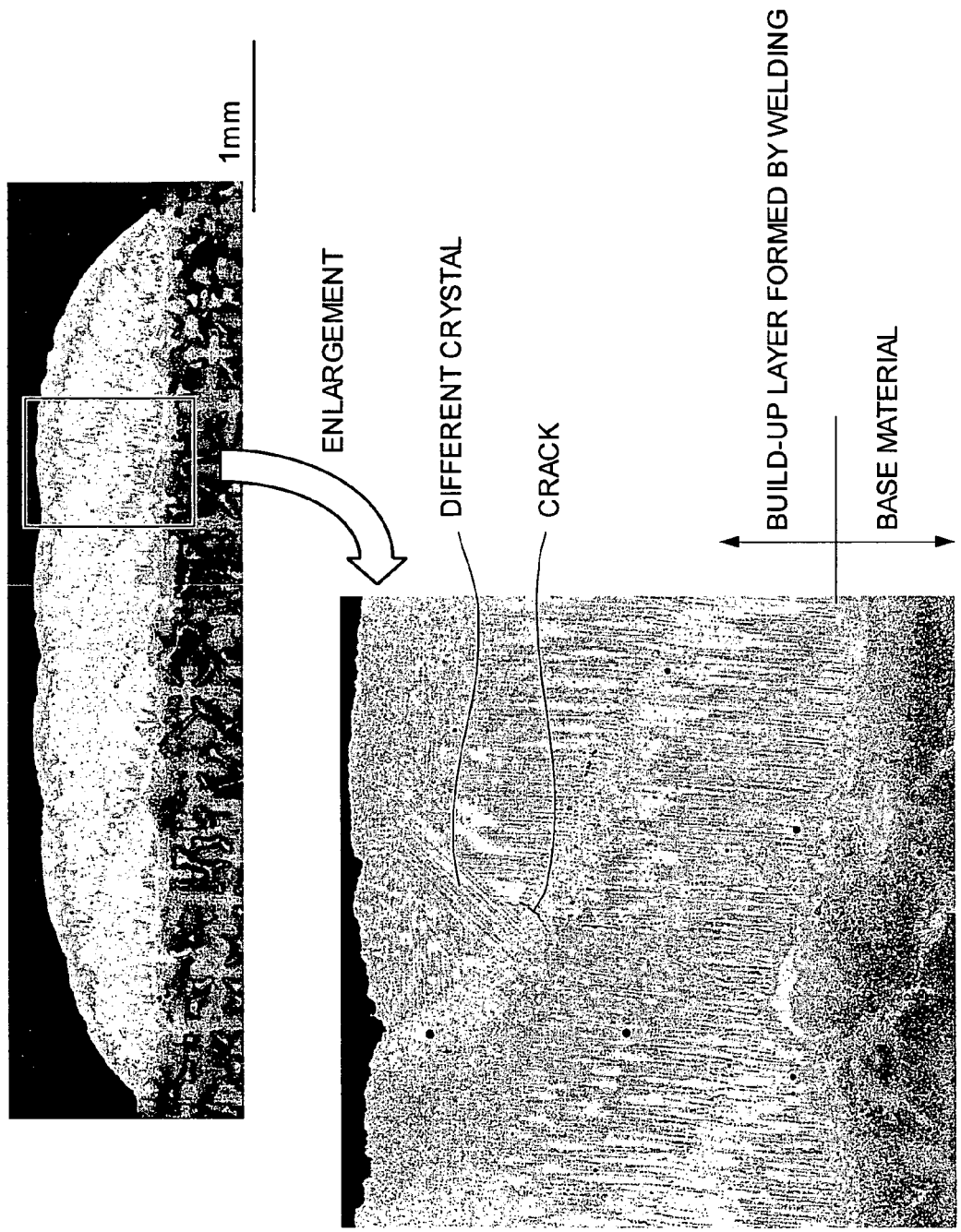
FIG. 21 is a photomicrograph of the build-up layer according to a conventional half-overlapping method.

A photomicrograph of a part of the build-up layer is shown in FIG. 20. FIG. 20 depicts the eleventh build-up portion 12-11 formed on the sixth build-up portion 12-6, the second build-up portion 12-2, and the seventh build-up portion 12-7.

FIG. 20 gives evidence that it is possible to form an excellent build-up layer without the different crystal according to the second embodiment.

Figure 5:
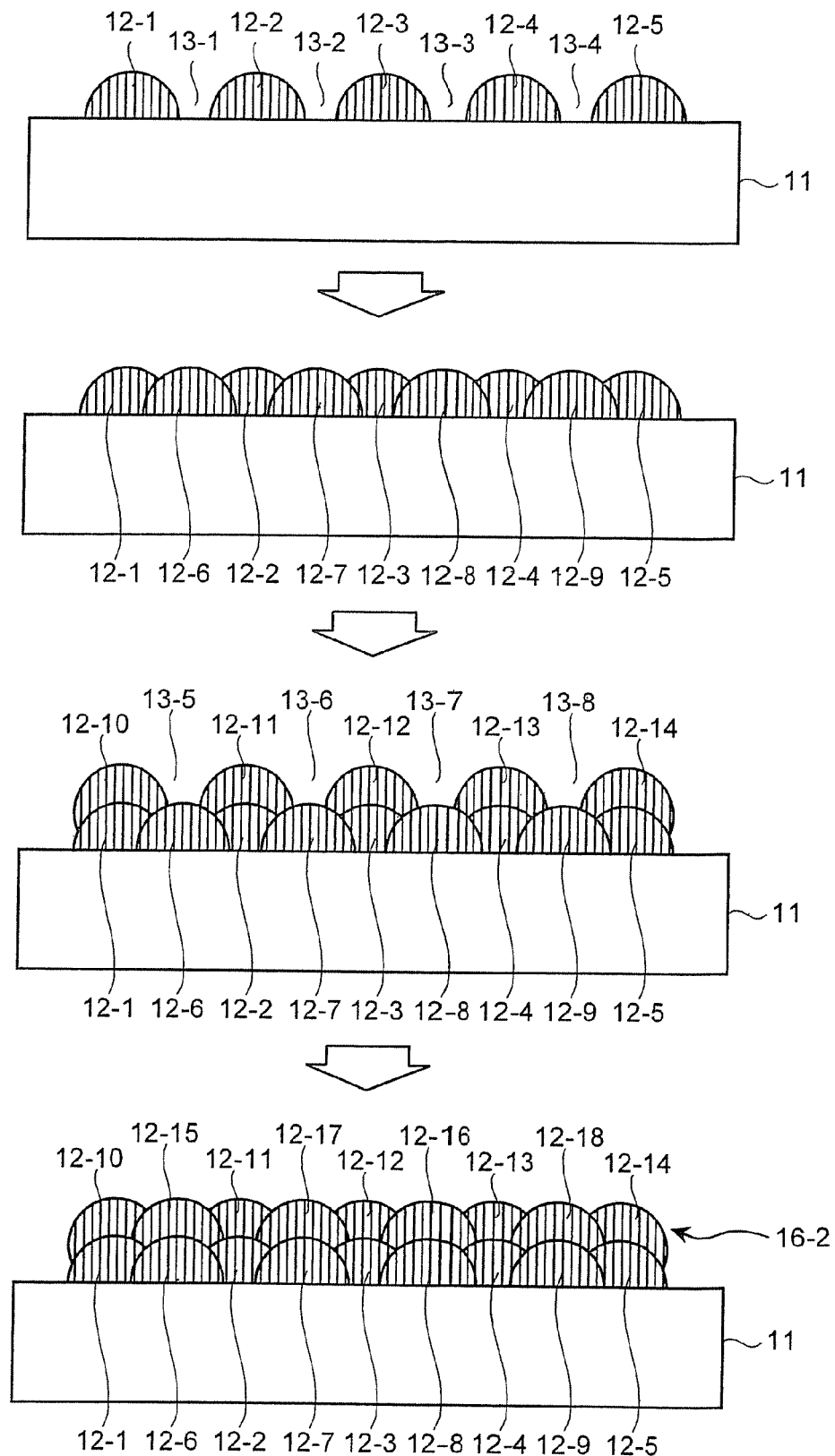
FIG. 5 is a schematic diagram that illustrates another method of forming a build-up layer according to the second embodiment.

FIG. 5 depicts an example of modified second embodiment.

As shown in FIG. 5, in the process of forming the second build-up layer 16-2, the sixteenth build-up portion 12-16 is formed between the twelfth build-up portion 12-12 and the thirteenth build-up portion 12-13 instead of being formed between the eleventh build-up portion 12-11 and the twelfth build-up portion 12-12.

As a result, the sixteenth build-up portion 12-16 is formed between the twelfth build-up portion 12-12, which is situated next to the eleventh build-up portion that is thermally influenced by the process that forms the fifteenth build-up portion 12-15, and the thirteenth build-up portion 12-13. Thus, it is possible to control the crystalline structure without the thermal influence, and to obtain an excellent build-up layer without different crystal.

Figure 6:
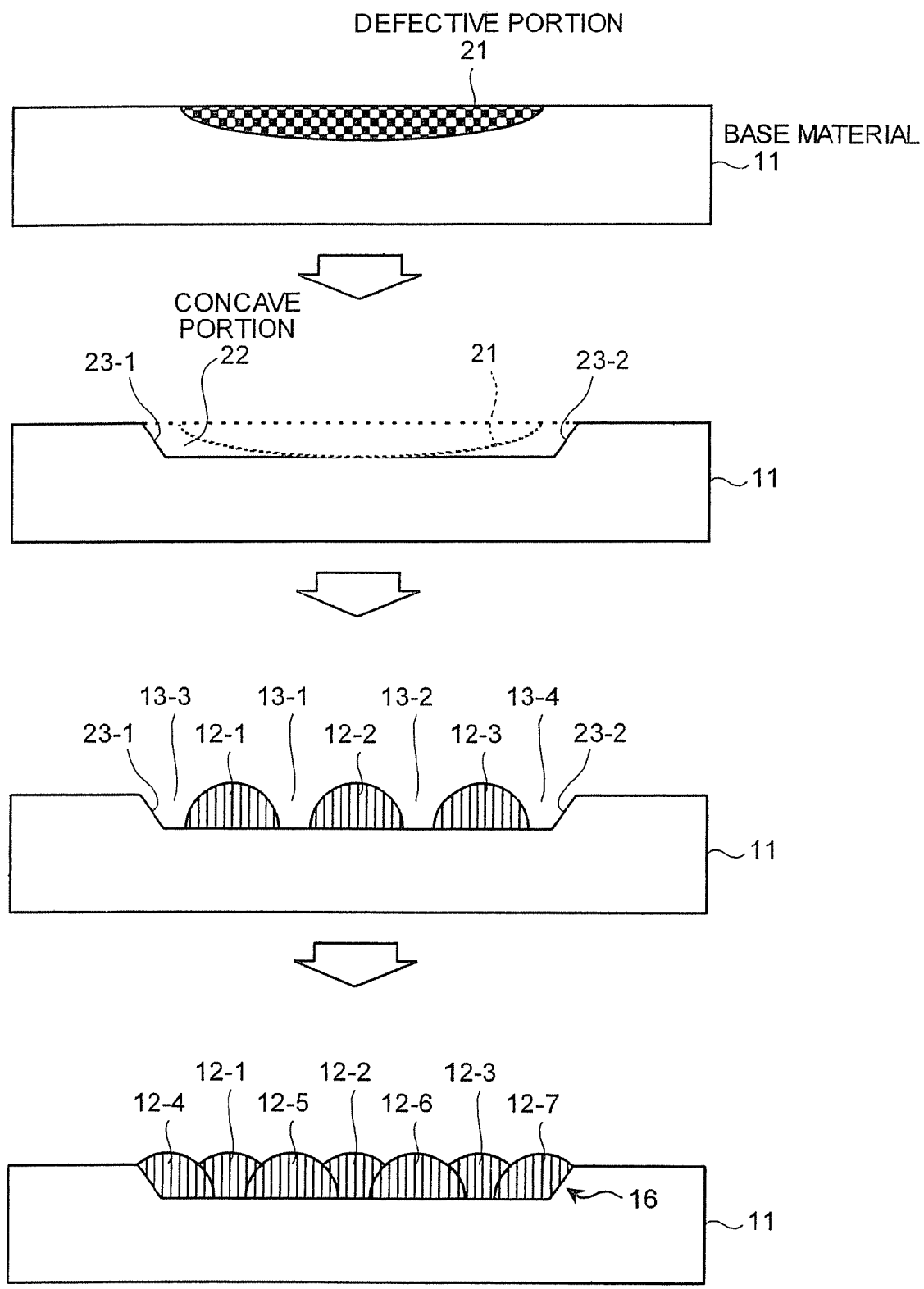
FIG. 6 is a schematic diagram that illustrates a method of forming a build-up layer according to a third embodiment.

FIG. 6 is a cross section for explaining formation of a build-up layer according to the third embodiment of the present invention. The same reference numerals are given to the same members that are described in the first embodiment; therefore, explanations of the same reference numerals are omitted.

The method of building-up according to the third embodiment of the present invention, when the base material 11 has a defective portion 21, the defective portion 21 is removed, then a build-up portion is formed in the portion where the defective portion 21 is removed to repair the defective portion.

As shown in FIG. 6, the defective portion 21 is removed from the base material 11 to form a concave portion 22. Opposite surfaces of an edge preparation portion of the concave portion 22 are beveled forming a first beveled portion 23-1 and a second beveled portion 23-2.

Then, using the same method as the method of the first embodiment, a plurality of build-up portions (three build-up portions in the present embodiment), the first build-up portion 12-1, the second build-up portion 12-2, the third build-up portion 12-3 are formed having a predetermined gap 13. From the fourth build-up portion 12-4 to the seventh build-up portion 12-7 are formed respectively in the gaps 13-1, 13-2, 13-3 that is a gap between the first build-up portion 12-1 and the first beveled portion 23-1, and 13-4 that is a gap between the third build-up portion 12-3 and the second beveled portion 23-2. Thus, the repairing process is completed by building up the layer 16 in the concave portion 22, which is formed by removing a portion that includes the defective portion 21.

The angle of the beveled portion is not particularly limited to a specific angle; however, for example 60°±20° may be suitable. It is possible to repair the defective part without causing the different crystal, because the thermal influence is alleviated due to the angle of the beveled portion becomes substantially the same as the slope of the first build-up portion.

Thus, it is possible to control the crystalline structure without thermal influence, and to repair the part where the defective portion 21 is removed satisfactory without causing the different crystal.

The concave portion 22, and the beveled portions 23-1 and 23-2 are formed in such a manner that the build-up portions become symmetric. Therefore, it is preferable that an odd number of build-up portions are formed all the time, because a thermal balance will be lost if there are an even number of build-up portions.

Figure 7:
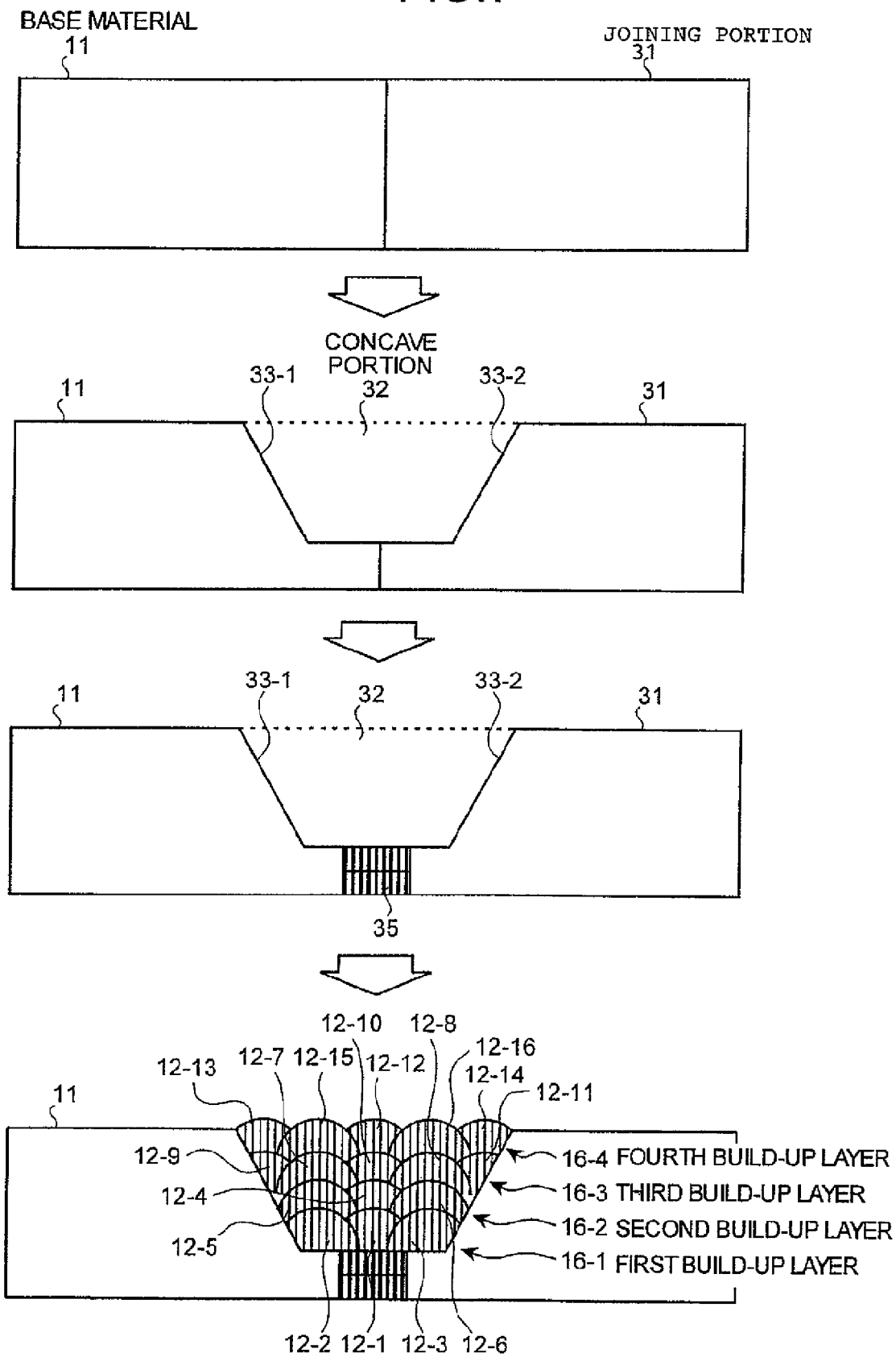
FIG. 7 is a schematic diagram that illustrates a method of forming a build-up layer according to a fourth embodiment.

FIG. 7 is a cross section for explaining formation of a build-up portion according to the fourth embodiment of the present invention. The same reference numerals are given to the same members that are described in the first embodiment; therefore, explanations of the same reference numerals are omitted.

The method of building-up according to the fourth embodiment of the present invention is to join a joining material 31 to the base material 11.

As shown in FIG. 7, first, an edge preparation is given across the joining material 31 and the base material 11.

Opposite surfaces of an edge preparation portion of a concave portion 32 are beveled forming a first beveled portion 33-1 and a second beveled portion 33-2.

Next, a bottom part of the concave portion is heated, and, then a molten joining is carried out. The molten joining is to be explained later.

A first gap 13-1 (not shown) and a second gap 13-2 (not shown) are formed by forming the first build-up portion 12-1 between the first beveled portion 33-1 and the second beveled portion 33-2. Then, the second build-up portion 12-2 is formed in the first gap 13-1, and the third build-up portion 12-3 is formed in the second gap 13-2.

Thus, the first build-up layer 16-1 is formed with the first build-up portion 12-1, the second build-up portion 12-2, and the third build-up portion 12-3. In this manner, the concave portion of the joining portion is filled from the bottom, and the joining of the base metal 11 with the joining material 31 is completed by forming the first to the fourth build-up layers 16-1 to 16-4 one after the other in the concave portion 32.

Thus, it is possible to control the crystalline structure without the thermal influence, and it is also possible to achieve an excellent joining that has no different crystal.

Figure 8:
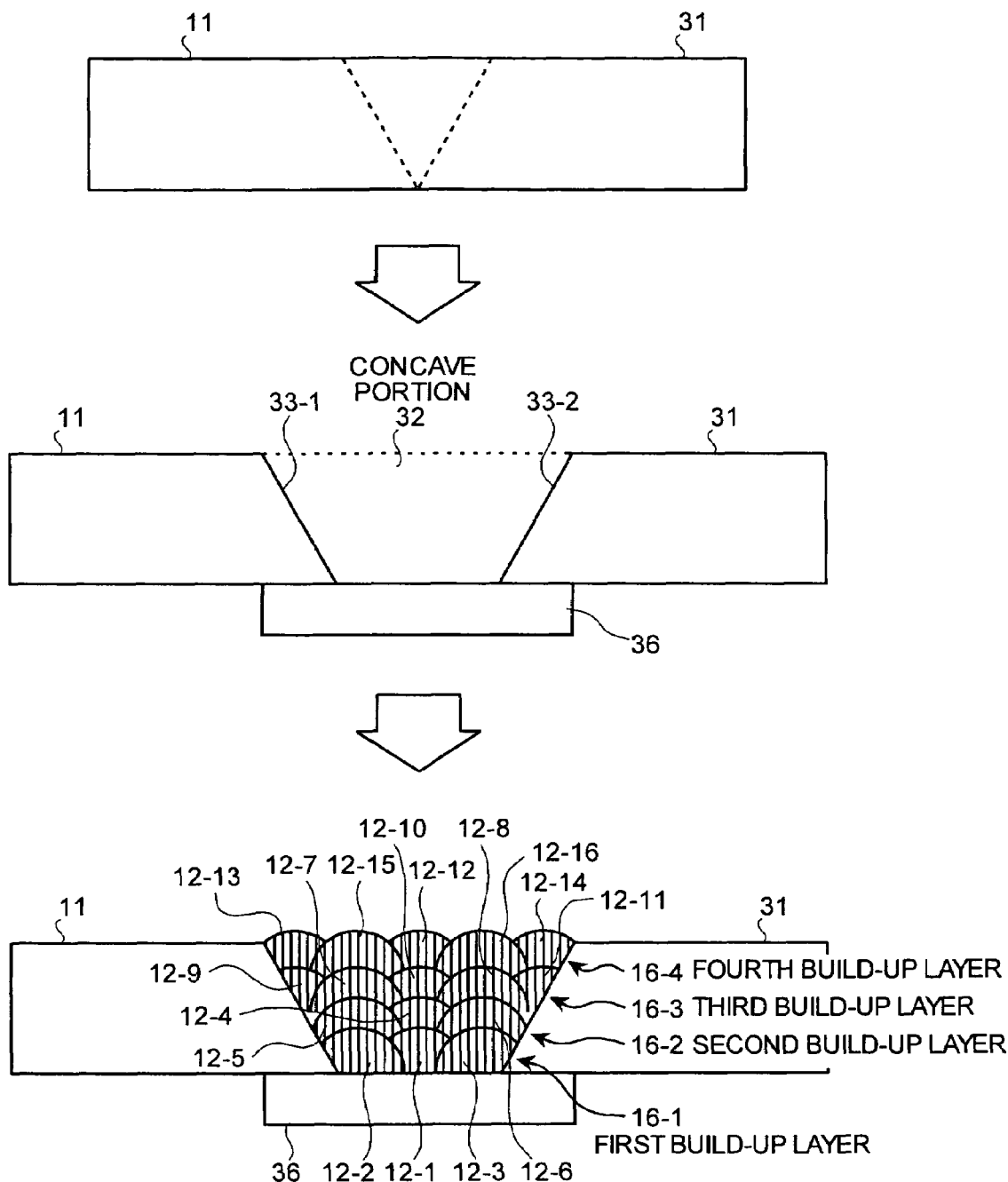
FIG. 8 is a schematic diagram that illustrates a method of forming a build-up layer according to a fourth embodiment.

A joining shown in FIG. 8 is a modified example of the fourth embodiment that depicts a case when the base material is thin. In this case, the joining is conducted using a patch metal 36 that has the same crystal structure and orientation with the base metal.

First, the base material 11 and the joining material 31 are butted, and are given the edge preparation to form the first beveled portion 33-1 and the second beveled portion 33-2. Then the concave portion 32 is formed with the patch metal 36 attached to the back side of the base material 11 and the joining material 31.

Then, the build-up portions or the plurality of build-up layers are formed in the concave portion 32 to fill the concave portion 32 in the same manner as described above, thus the joining of the both materials are completed.

Figure 9:
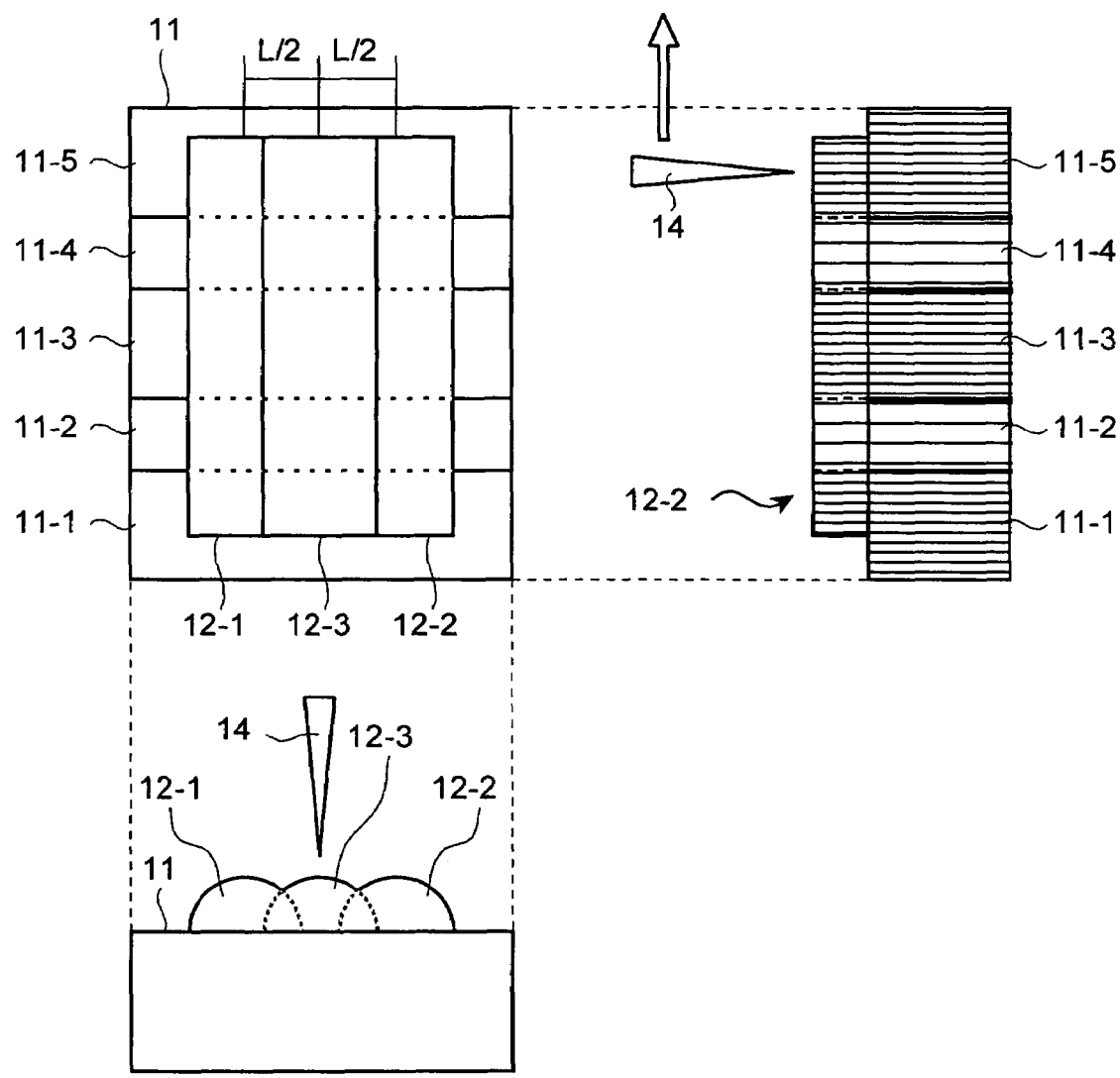
FIG. 9 is a schematic diagram that illustrates a method of forming a build-up layer according to a fifth embodiment.

FIG. 9 is a three-view drawing to form a build-up portion according to the fifth embodiment of the present invention. The same reference numerals are given to the same members that are described in the first embodiment; therefore, explanations of the same reference numerals are omitted.

The method of building-up according to the fifth embodiment of the present invention is to join a joining material 31, without cracks, to the base material 11 that consist of a plurality of material having different crystal orientations. For example, sometimes the base materials are given different crystal orientations depending on the characteristics in strength of the base materials to boost the strength of the base materials in high temperature.

In the present embodiment, as shown in FIG. 9, when the base material is made up of five different types of base materials 11-1 to 11-5 each having a different crystal orientation, the first build-up portion 12-1 and the second build-up portion 12-2 are formed having the gap 13 in an orthogonal direction to the crystal growth of the base material.

Then, the third build-up portion 12-3 is formed in the gap 13, thus the build-up layer 16 is formed.

In the present embodiment, the crystal orientation of the build-up portions, which is formed on the surface of the base materials, becomes the same as the direction of the crystal orientation of the underlying base materials. As a result, in the present embodiment, cracks are prevented from occurring, which are inherent when the first build-up portion 12-1 and the second build-up portion 12-2 are formed in a parallel direction to the crystal growth of the base material on the border of any two base materials. FIG. 9 illustrates a concept that the crystal orientation of the base material is the same as the crystal orientation of the build-up portion 12-2 by indicating the both crystal orientations with the same patterns.

Figure 10:
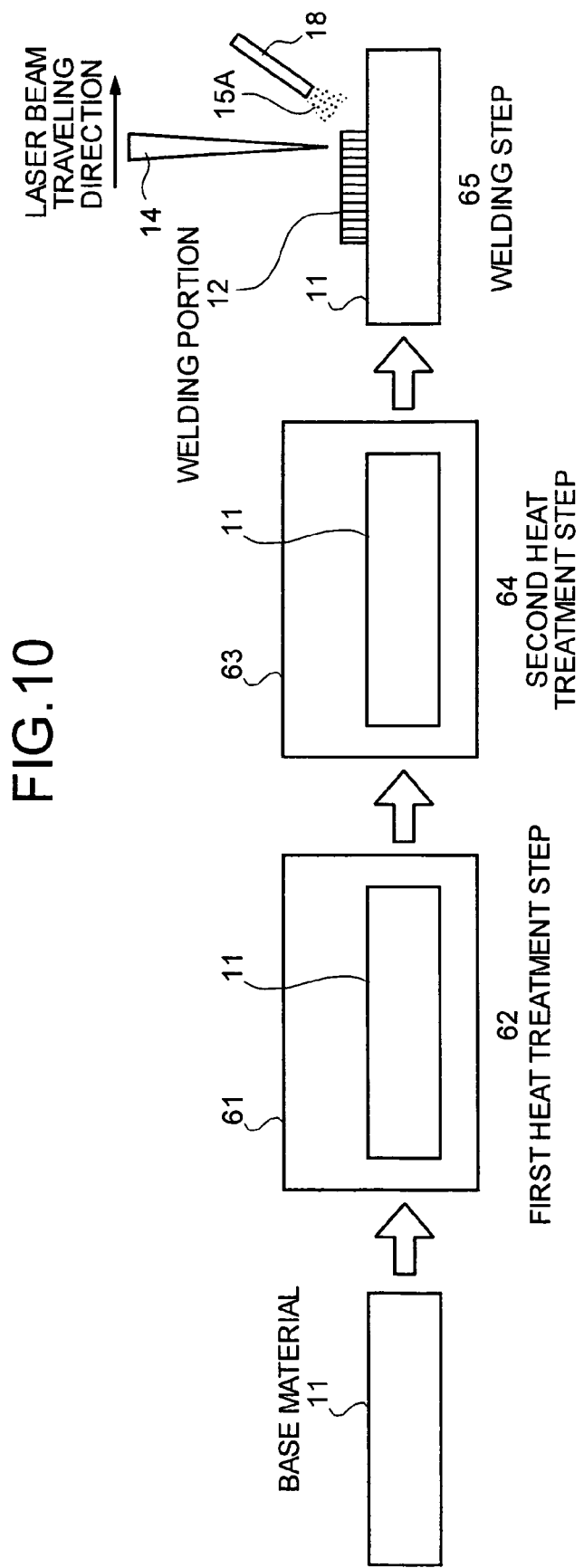
FIG. 10 is a process diagram according to a sixth embodiment.

FIG. 10 is a rough process diagram of the sixth embodiment of the present invention.

In the present embodiment, a precipitated material or a micro segregation are alleviated or prevented from occurring while maintaining a single crystal or unidirectionally solidified crystal structures, by heat-treating the base material below the melting point of the base material before welding.

In an ordinary welding, a solution treatment generally means a heat treatment aimed at improving the strength of the base material by heat-treating the base material for several hours at a temperature lower than the solidus temperature, which is a transitional temperature to a region where solid and liquid of a metal co-exist, of the base material by several tens of degrees Celsius (particularly it is preferable to be lower than the solidus temperature by 30° C. to 50° C.).

On the other hand, in the present invention, heat treatment means heat-treat the base material at a temperature range that is higher than the solution treatment temperature of the base material. To be more specific, 1) heat-treating at a temperature equivalent to the solidus temperature of the base material, 2) heat-treating at the solidus temperature of the solidus temperature of the base material or higher, 3) heat-treating at the temperature higher than the liquidus temperature of the base material, which is the temperature the base material is liquidized completely.

The base material is heat-treated by a-two-step heat treatment method before a build-up welding is performed on the base material according to the present invention. Namely, a pre-welding heat treatment, which consists of an ordinary solution treatment and a higher temperature heat treatment that is performed at a higher temperature than the solution treatment, is given to the base material.

To be more specific, as shown in FIG. 10, an ordinary solution treatment is given to the base material 11 as a first heat treatment 62 at a first heating furnace 61, then any one of the higher temperature heat treatments 1) to 3) described above is given as a second heat treatment 64 at a second heating furnace 63.

Subsequently, a welded portion 12 is formed on the surface of the base material 11 by performing a build-up welding, using, for example, a laser beam 14 at a welding step 65. Numeral 18 in FIG. 10 indicates a feed pipe that feeds a powdery filler metal 15A.

Due to the above-described heat treatments, it is possible to extinguish or alleviate a precipitated material or a micro segregation, thus, a different crystal growth that may otherwise occur in the subsequent welding due to the micro segregation can be prevented from occurring.

In the present embodiment, for example, a unidirectionally solidified material is cast into the base material using an alloy of nickel (trade name: CM247LC, made by Cannon Muskegon Corporation), solidus temperature: 1280° C., liquid crystal temperature: 1370° C.). Then, a solution treatment was given to CM247LC at 1260° C. for three hours in the first heat treatment 62. Then, the precipitated material and the micro segregation were prevented from occurring by controlling a quantity of heat per unit area to $1.5 \times 10^6$ Joule per square meter ($J/m^2$).

Figure 22:
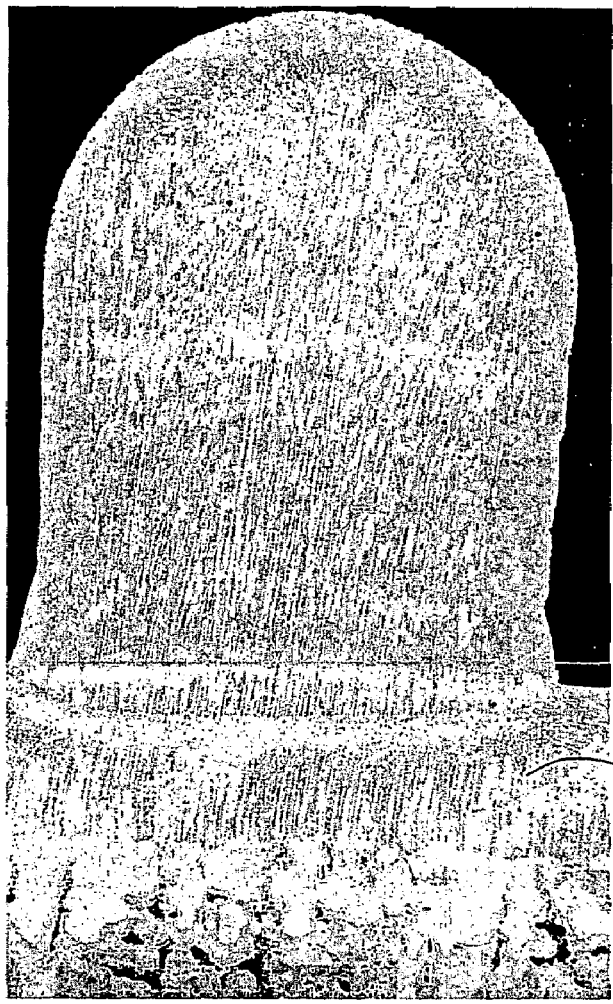
FIG. 22 is a photomicrograph of the build-up layer according to the sixth embodiment.

FIG. 22 is a photomicrograph of a build-up portion formed by a plurality of build-up portions 12, after giving the first heat treatment and the second heat treatment to the base material 11. As is clear from FIG. 22, the different crystal is prevented from occurring by giving the solution treatment as the first heat treatment and the higher temperature heat treatment as the second heat treatment to the base material 11.

Figure 23:
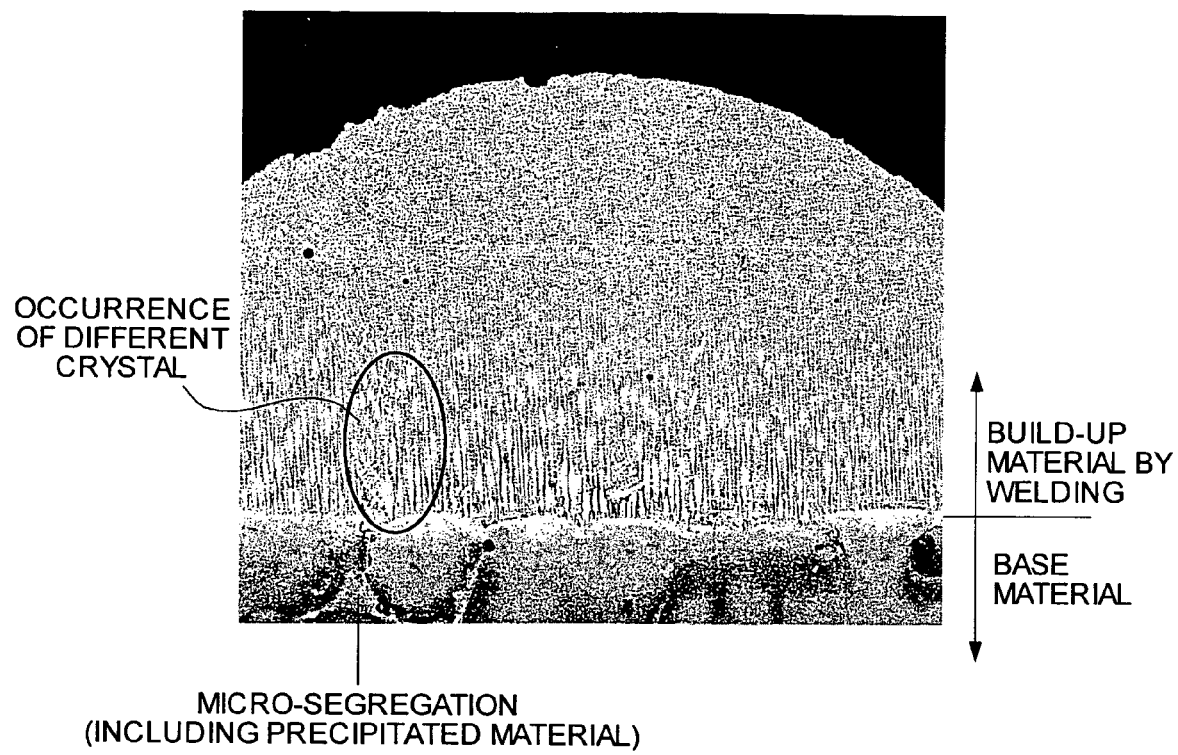
FIG. 23 is a photomicrograph of the conventional build-up layer having micro segregation.

In contrast, as shown in FIG. 23, when only a first heat treatment was given, a micro segregation occurred in the base material, and a different crystal occurred in the build-up portion.

In the present embodiment, although the welding portion 12 was made in a half-cylindrical shape, the micro segregation can be extinguished and a different crystal can be prevented from occurring in the case of a plurality of welding in the first to the fifth embodiments described above by applying these pre-treatments.

Figure 11:
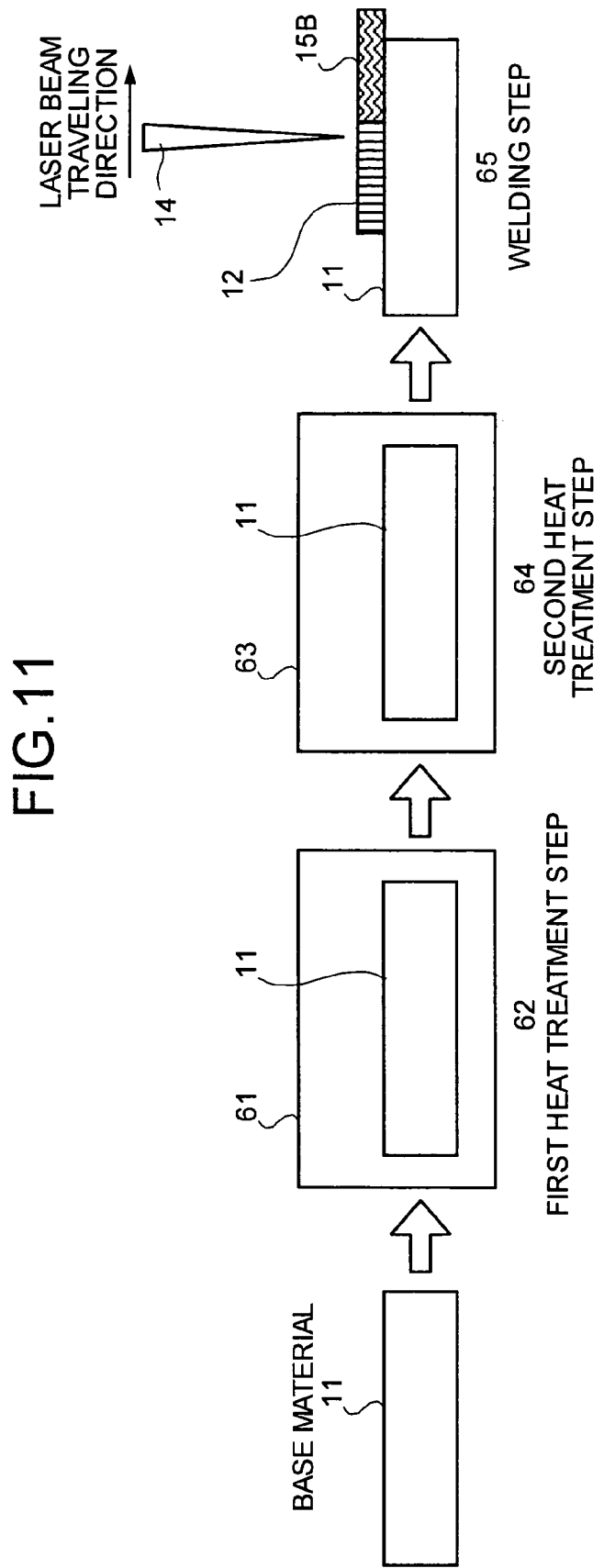
FIG. 11 is another process diagram according to the sixth embodiment.

As shown in FIG. 11, a laid wire filler material 15B can be used.

Figure 12:
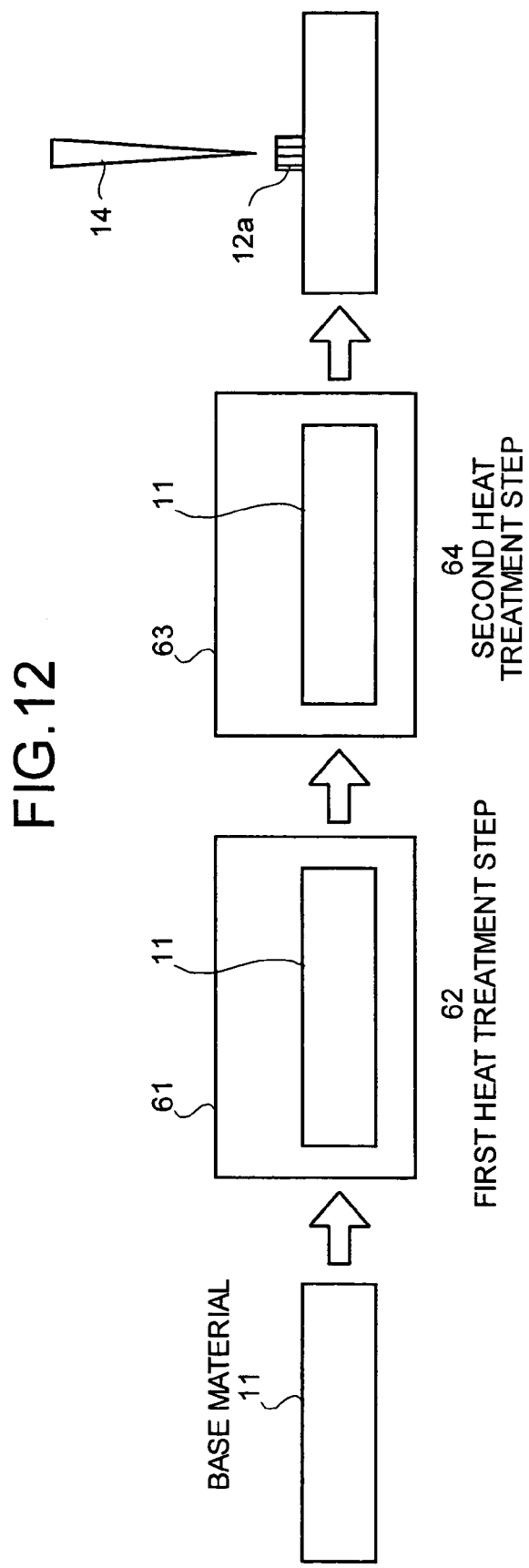
FIG. 12 is still another process according to the sixth embodiment.

As shown in FIG. 12, the build-up portion can be made an insular portion 12a instead of a half-cylindrical shape.

It is possible to fill-up a concave portion in the same manner.

These pre-treatments can be applied to equiaxed structural materials.

Figure 13:
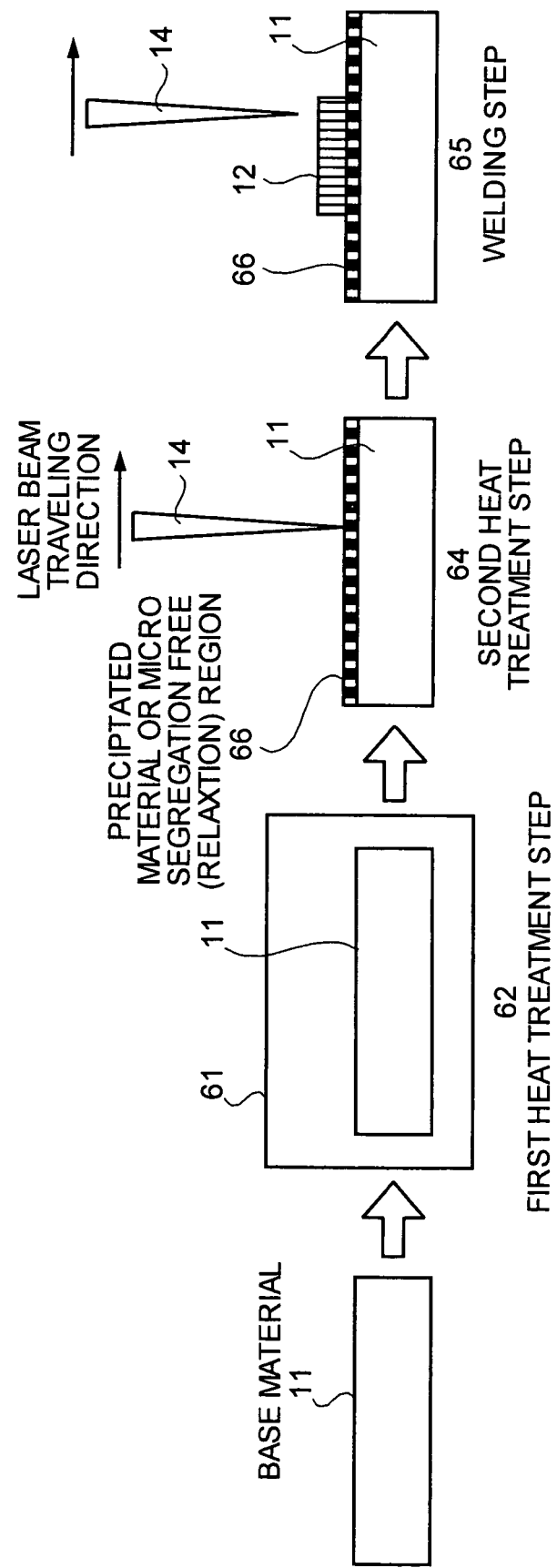
FIG. 13 is a process diagram according to a seventh embodiment.

FIG. 13 is a process diagram according to a seventh embodiment of the present invention. The same reference numerals are given to the same members that are described in the sixth embodiment; therefore, explanations of the same reference numerals are omitted.

In the embodiments shown in FIGS. 10 to 13, although the second heat treatment is given to the entire body of the base material in a furnace, the present invention is not limited to this method. The second heat treatment 64 may be performed using a laser beam 14 to perform the second heat treatment of the base material locally, after performing the first heat treatment 62 using, for example, a furnace 61 to form a precipitated material or a micro segregation free (or alleviated) region 66.

Figure 14:
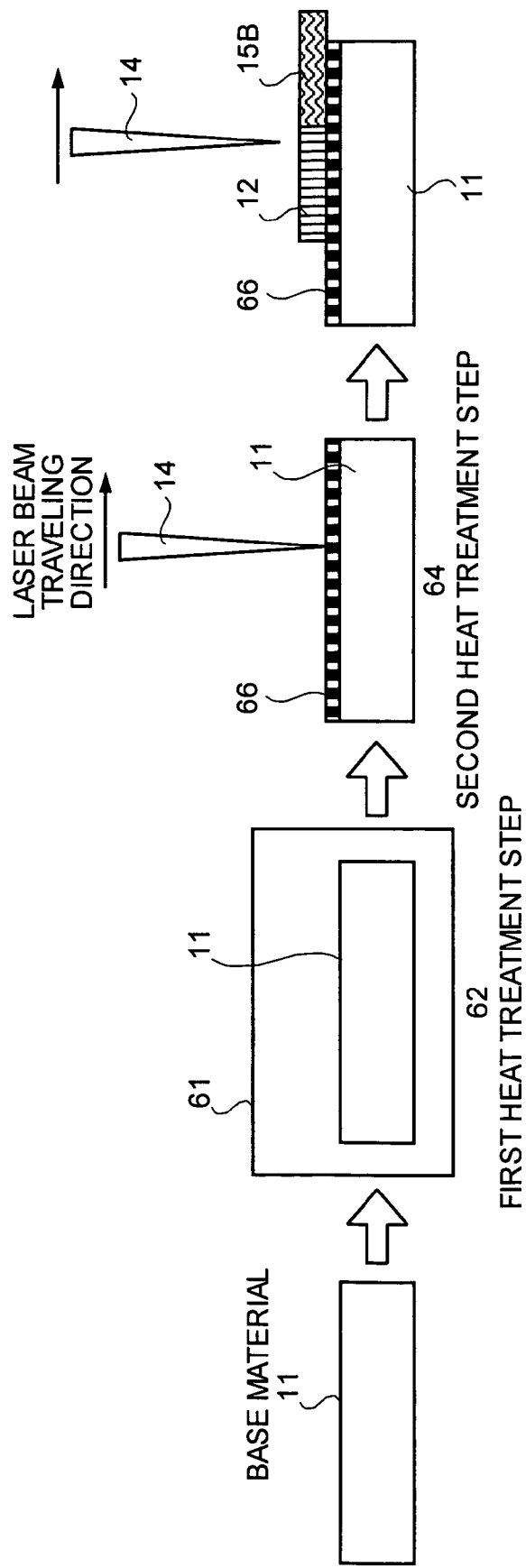
FIG. 14 is another process diagram according to the seventh embodiment.

As shown in FIG. 14, a laid wire filler material 15B can be used.

Figure 15:
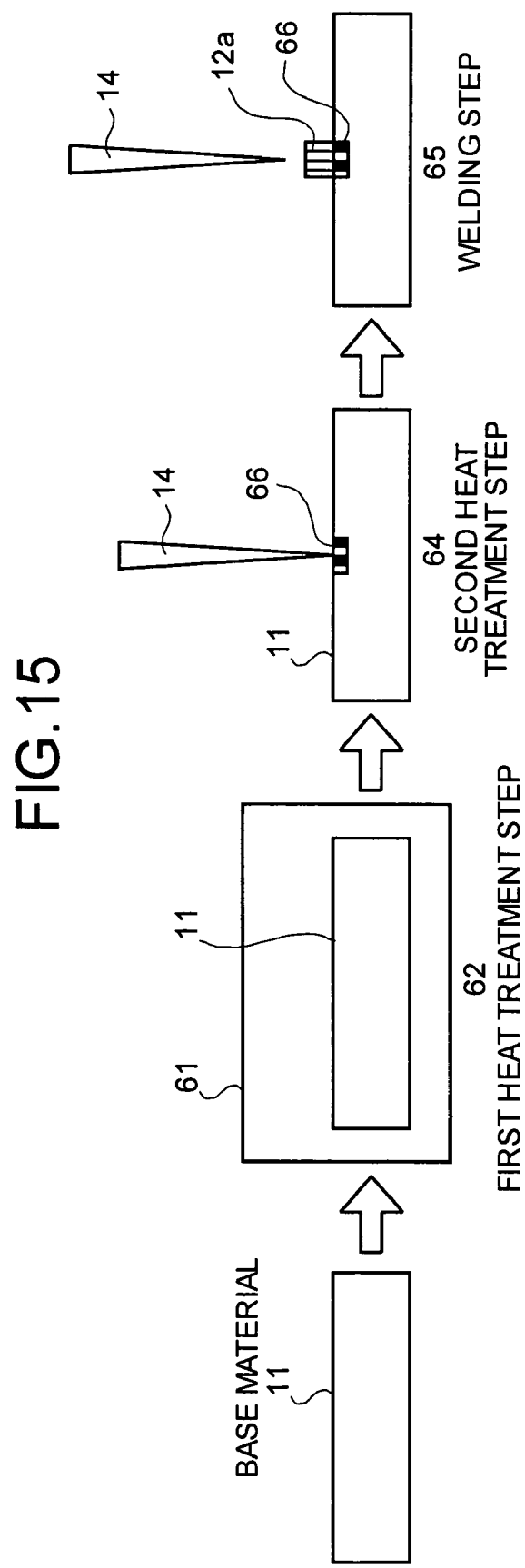
FIG. 15 is still another process according to the seventh embodiment.

As shown in FIG. 15, the build-up portion can be made an insular portion 12a instead of a half-cylindrical shape. In this case, a sporadic second heat treatment 64 by the laser beam will do.

Figure 16:
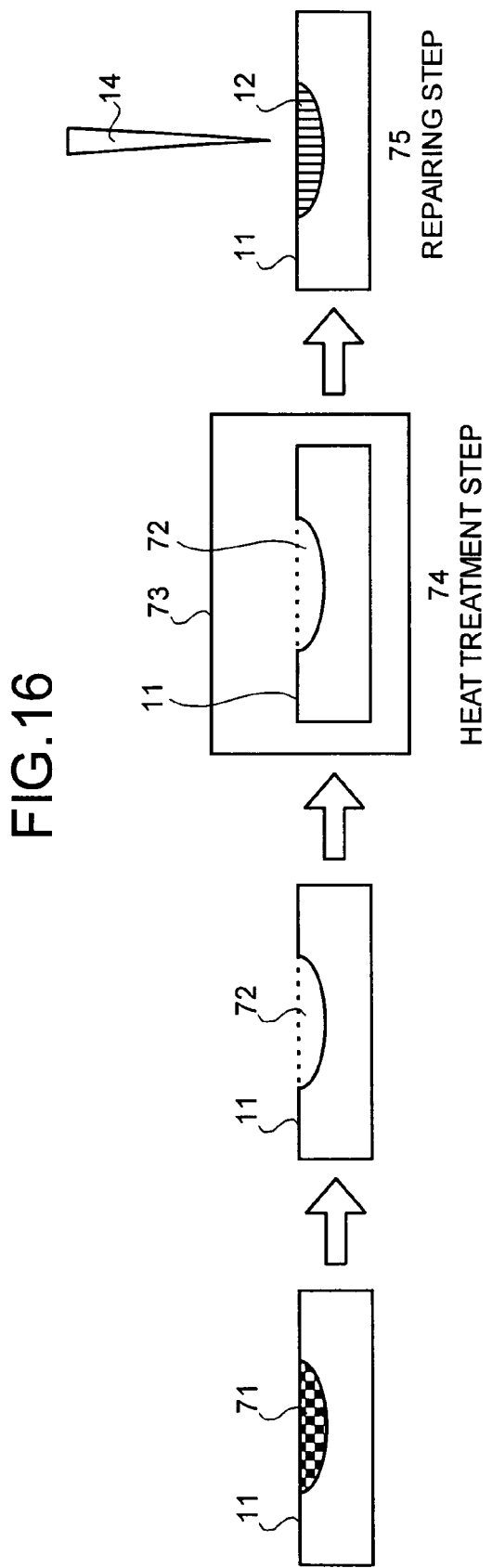
FIG. 16 is a process diagram according to an eighth embodiment.

FIG. 16 is a process diagram according to an eighth embodiment of the present invention. The same reference numerals are given to the same members that are described in the sixth embodiment; therefore, explanations of the same reference numerals are omitted.

In the present embodiment, if the base material has a defective part, the defective part 71 is removed, and then a heat treatment is given to the removed part before the defective part is repaired.

As shown in FIG. 16, a concave portion 72 is formed by removing the defective part 71 from the base material 11. Then, a heat treatment 74 is performed in a furnace 73 to extinguish a micro segregation.

Then, a repairing step 75 is performed by forming a build-up portion 12 using an ordinary welding process.

Figure 17:
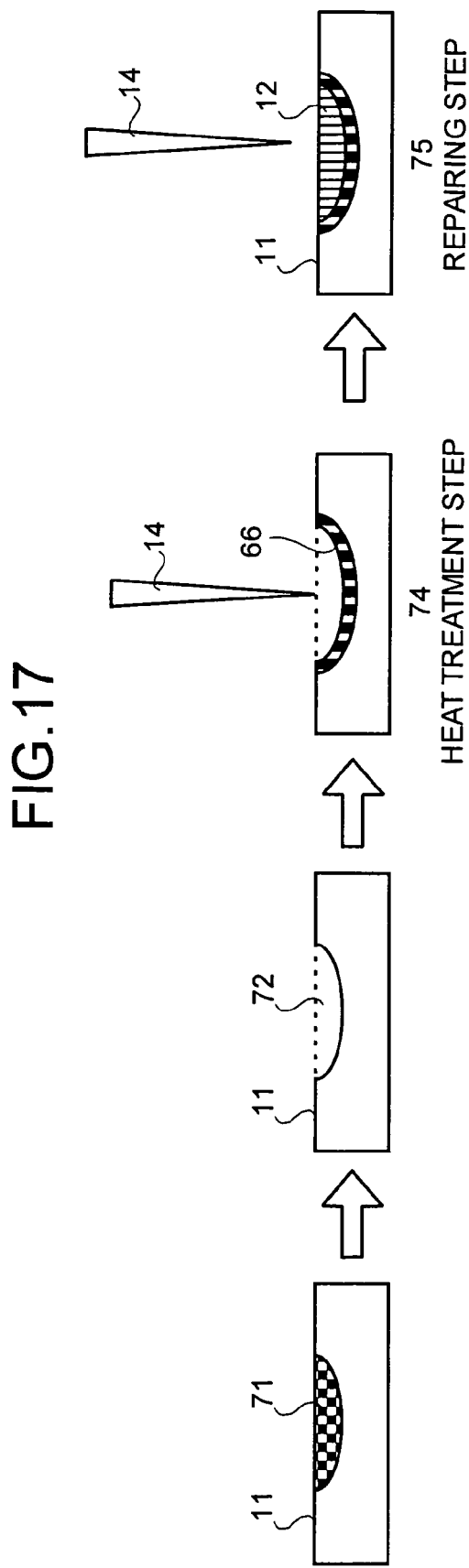
FIG. 17 is another process diagram according to the eighth embodiment.

FIG. 17 illustrates, in a process of repair of a defective part, a case that the heat treatment 74 is performed using a laser beam 14 just like the seventh embodiment.

Figure 18:
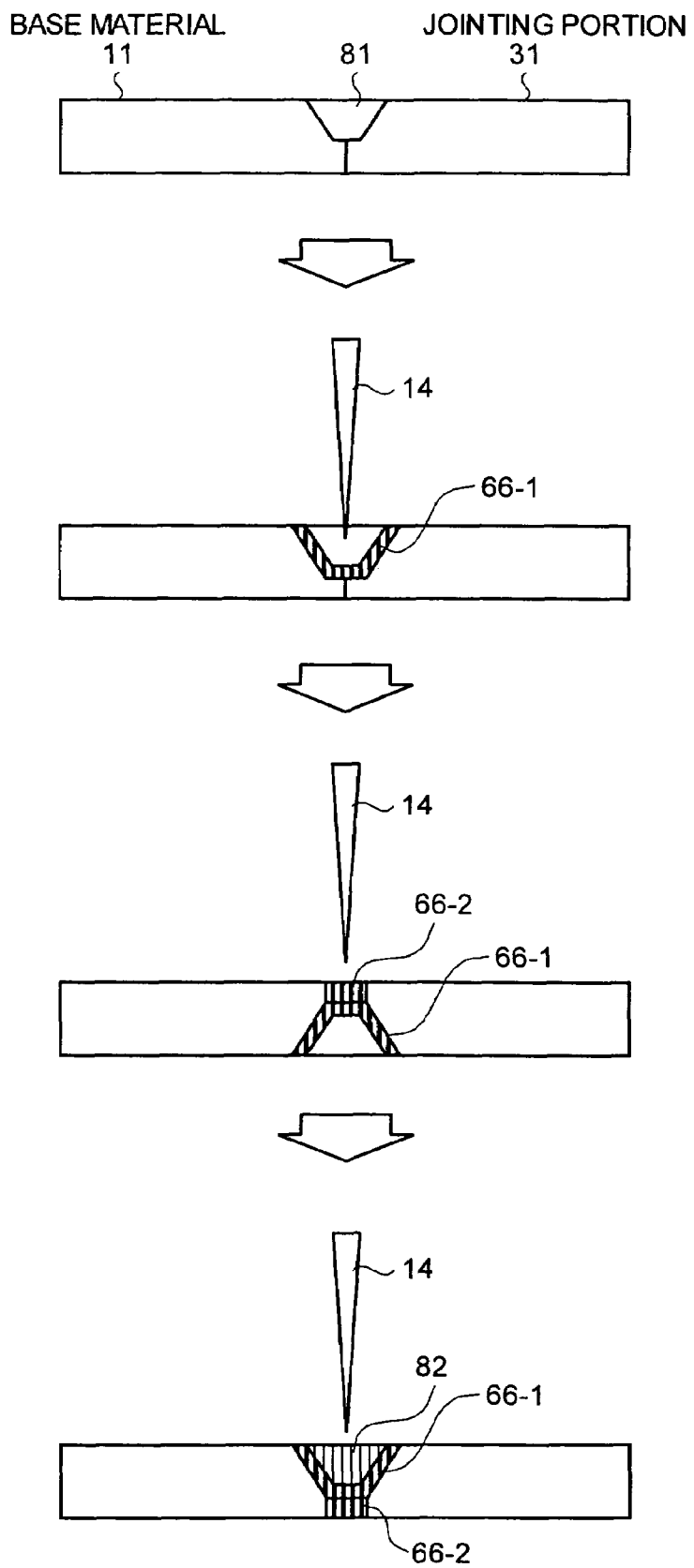
FIG. 18 is a process diagram according to a ninth embodiment.

FIG. 18 is a process diagram according to a ninth embodiment. The same reference numerals are given to the same members that are described in the sixth embodiment; therefore, explanations of the same reference numerals are omitted.

A method of pre-treatment according to the ninth embodiment of the present invention is applied to the case when the other joining material 31 is joined to the base material 11.

As shown in FIG. 18, first, an edge preparation is given across the joining material 31 and the base material 11 to form a concave portion 81 that is beveled. Then, the second heat treatment is given to a predetermined thickness of the concave portion 81 to form a first precipitated material or a micro segregation free region 66-1.

Then, the joining material 31 and the base material 11 are turned upside down to give from the backside the second heat treatment to the portion where the joining material 31 and the base material 11 meet to form a second precipitated material or a micro segregation free region 66-2. Then, the joining material 31 and the base material 11 are turned upside down again to form a build-up portion 82 in the concave portion 81.

Thus, it is possible to repair the base material and the joining material without the micro segregation and the different crystal when the base material and the joining material are welded.

Figure 19:
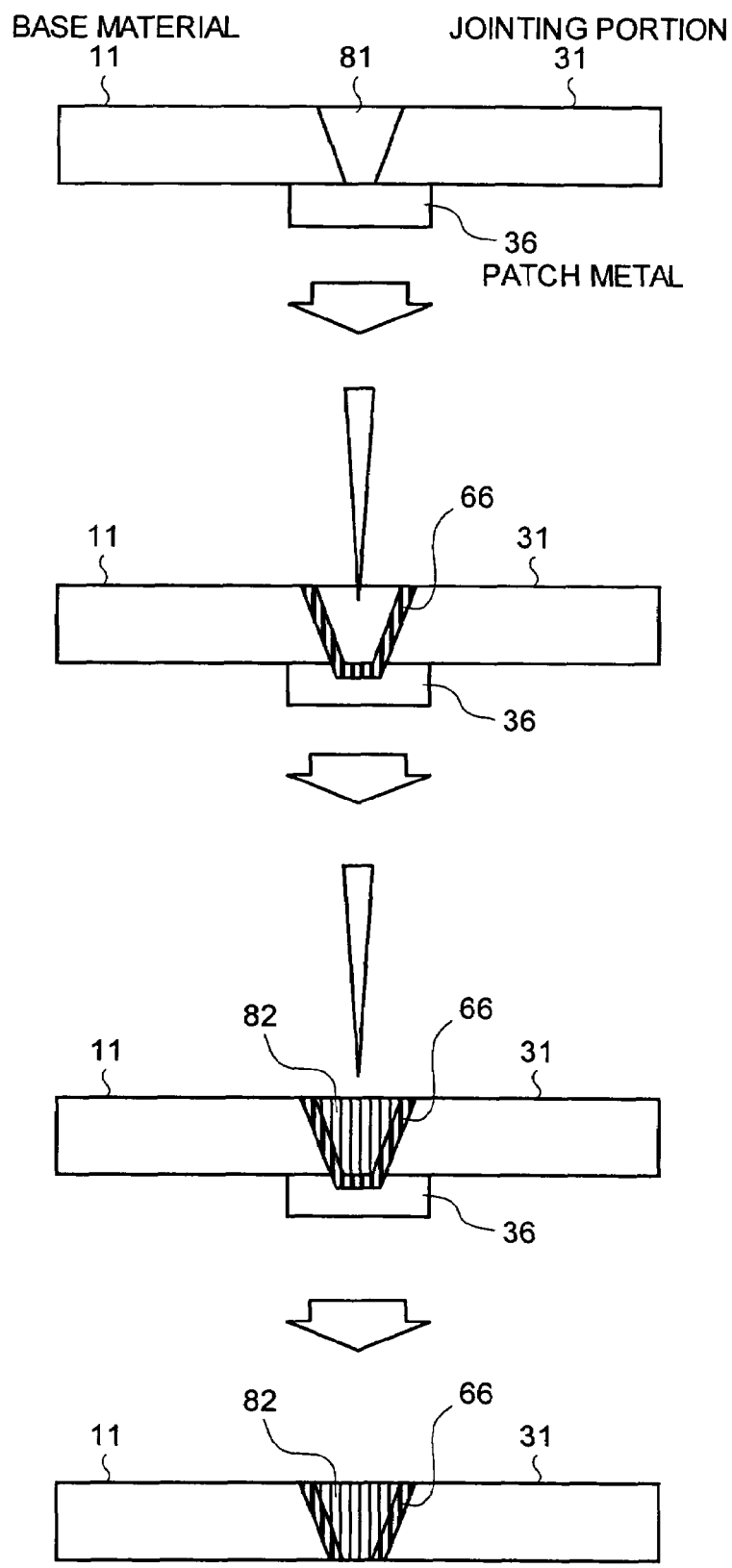
FIG. 19 is another process diagram according to the ninth embodiment.

The joining shown in FIG. 19 is a modification of the ninth embodiment depicting the case when the base material is thin; in the present case the joining is performed using a patch metal 36 that has the same crystal structure and orientation with the base material.

The base material 11 and the joining material 31 are butt-joined, and an edge preparation is performed to form a concave portion 81 at the butt-joined portion. Then, the patch metal 36 is attached to the back side of the base material 11 and the joining material 31.

Then, the second heat treatment is given to the concave portion 81 and the patch metal 36 to form a precipitated material or a micro segregation free region 66. Subsequently, a build-up portion 82 is formed in the concave portion 81, and the patch metal 36 is removed.

Thus, it is possible to repair the base material and the joining material without the micro segregation and the different crystal when the base material and the joining material are welded.

Then, a plurality of build-up portions is formed in the concave portion 81 to fill up the concave portion 81 in the same manner as described above. Thus, the joining between the base material 11 and the joining material 31 is completed.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A welding method for forming a molten build-up portion on a base material that is any one of a single crystal material and a unidirectionally solidified crystal material, comprising;
    forming a plurality of build-up portions on the base material while maintaining a predetermined gap between adjacent build-up portions; and
    forming a build-up portion in each of the predetermined gaps,
    wherein the predetermined gap is determined such that the build-up portion formed in each of the predetermined gap has a cross sectional area, in a direction perpendicular to a surface of the base material, substantially the same as a cross sectional area, in the direction perpendicular to the surface of the base material, of the plurality of build-up portions formed on the base material,
    wherein a symmetric thermal condition is kept during forming of the build-up portion so that a build-up layer is formed of at least one of the single crystal material and the unidirectionally solidified crystal material having the same crystal structure and orientation as the base material.

2. The welding method according to claim 1,
    wherein the welding method comprises a pre-treatment that includes,
    conducting solution treatment at a temperature T1 that is lower than the solidus temperature of the base material by 30 degrees Celsius (° C.) to 50° C.; and
    conducting heat treatment at a temperature that is higher than the temperature T1 to prevent a precipitated material or a micro segregation from occurring.

3. A welding method for forming a molten build-up portion on a base material that is any one of a single crystal material and a unidirectionally solidified crystal material, comprising:
    forming a plurality of build-up portions on the base material while maintaining a first predetermined gap between adjacent build-up portions;
    forming a first build-up layer by forming a build-up portion in each of the first predetermined gaps;
    forming a plurality of build-up portions on the first build-up layer while maintaining a second predetermined gap between adjacent build-up portions; and
    forming a second build-up layer by forming a build-up portion in each of the second predetermined gaps,
    wherein the first predetermined gap and the second predetermined gap are determined such that the build-up portion formed in each of the first predetermined gap and the second predetermined gap has a cross sectional area, in a direction perpendicular to a surface of the base material, substantially the same as a cross sectional area, in the direction perpendicular to the surface of the base material, of the plurality of build-up portions formed on the base material,
    wherein a symmetric thermal condition is kept during forming of the build-up portion so that the first and second build-up layers are formed of at least one of the single crystal material and the unidirectionally solidified crystal material having the same crystal structure and orientation as the base material.

4. The welding method according to claim 3,
    wherein at least two build-up layers are formed by repeatedly forming the build-up layer on the previously formed build-up layer.

5. The welding method according to claim 3,
    wherein at least two build-up layers are formed by repeatedly forming the build-up layer by forming the build-up portion in each of the predetermined gaps, and
    wherein the welding method comprises a pre-treatment that includes, conducting solution treatment at a temperature T1 that is lower than the solidus temperature of the base material by 30 degrees Celsius (° C.) to 50° C; and
    conducting heat treatment at a temperature that is higher than the temperature T1 to prevent a precipitated material or a micro segregation from occurring.

6. The welding method according to claim 2 or 5, wherein the heat treatment is conducted at any one of the following temperatures:
- equivalent to the solidus temperature of the base material;
- higher than the solidus temperature of the base material; and
- liquidus temperature of the base material.

7. The welding method according to claim 1, wherein the build-up portion in the predetermined gap is formed excepting an immediately adjacent gap in which a directly previous build-up portion is formed.

8. The welding method according to claim 1 or 3, wherein the build-up portion is insular or a half-cylindrical.

9. The welding method according to claim 1 or 3, wherein the base material is the unidirectionally solidified crystal, and the half-cylindrical build-up portion is formed in such a direction that is orthogonal to a direction of crystal growth of the base material.

10. The welding method according to claim 2 or 5, wherein the heat treatment is conducted by heat sources which heat up locally.

11. The welding method according to claim 10, wherein the heat sources include a laser beam, an electron beam, and plasma.

12. A repair method for repairing a molded article by using the welding method according to claim 1 or 3, comprising:
- removing a defective portion from the molded article to form a concave portion; and
- forming the build-up layer on the concave portion.

13. The repair method according to claim 12, wherein the removing step includes forming the concave potion with opposite surfaces beveled.

14. The repair method according to claim 13, wherein angles of the opposite surfaces of the edge preparation portion are 60°±20°.

15. The repair method according to claim 13, wherein an odd number of build-up portions are formed as a build-up layer on the concave portion.

16. A joining method for joining a joining material with the base material by using the welding method according to claim 1 or 3, comprising:
- conducting an edge preparation across the joining material and the base material to form a concave portion; and
- forming the build-up layer on the concave portion.

17. The joining method according to claim 16, wherein the edge preparation includes forming the edge preparation portion with opposite surfaces beveled.

18. The joining method according to claim 17, wherein angles of the opposite surfaces of the edge preparation portion are 60°±20°.

19. The joint method according to claim 16, wherein an odd number of build-up portions are formed as a build-up layer on the concave portion.

20. The joining method according to claim 17, further comprising:
- using a patch metal that has a same crystal structure and orientation with the base material when the base material is thin.

21. The welding method according to claim 1 or 3, further comprising:
- providing a welding portion on the base material, the providing step including a pre-treatment that includes:
- conducting solution treatment at a temperature $T1$ that is lower than the solidus temperature of the base material by 30 degrees Celsius (°C.) to 50 °C.; and conducting heat treatment at a temperature that is higher than the temperature $T1$ to prevent a precipitated material or a micro segregation from occurring.

22. The welding method according to claim 21, wherein the heat treatment is conducted at any one of the following temperatures;
- equivalent to the solidus temperature of the base material;
- higher than the solidus temperature of the base material; and
- liquidus temperature of the base material.

23. The welding method according to claim 3, wherein the build-up portion in the first predetermined gap and the second predetermined gap are formed excepting an immediately adjacent gap in which a directly previous build-up portion is formed.

* * * * *